United States Patent
Matsuo et al.

(10) Patent No.: US 10,700,453 B2
(45) Date of Patent: Jun. 30, 2020

(54) CONNECTOR ASSEMBLY

(71) Applicant: JAPAN AVIATION ELECTRONICS INDUSTRY, LIMITED, Tokyo (JP)

(72) Inventors: Kosuke Matsuo, Tokyo (JP); Atsushi Tanaka, Tokyo (JP); Shinichiro Nakajima, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/337,034

(22) PCT Filed: Jun. 5, 2017

(86) PCT No.: PCT/JP2017/020746
§ 371 (c)(1),
(2) Date: Mar. 27, 2019

(87) PCT Pub. No.: WO2018/078930
PCT Pub. Date: May 3, 2018

(65) Prior Publication Data
US 2020/0036115 A1 Jan. 30, 2020

(30) Foreign Application Priority Data
Oct. 31, 2016 (JP) .................. 2016-212537

(51) Int. Cl.
*H01R 12/50* (2011.01)
*H01R 13/24* (2006.01)

(52) U.S. Cl.
CPC ......... *H01R 12/50* (2013.01); *H01R 13/2414* (2013.01)

(58) Field of Classification Search
CPC ...... H01R 12/50; H01R 12/714; H01R 12/78; H01R 13/2407; H01R 13/2414;
(Continued)

(56) References Cited

U.S. PATENT DOCUMENTS

| 4,904,879 A | * | 2/1990 | Rudy, Jr. | ............ H01R 31/005 307/17 |
| 7,364,433 B2 | * | 4/2008 | Neidlein | ............ H01R 13/24 439/39 |

(Continued)

FOREIGN PATENT DOCUMENTS

| CN | 104600452 A | 5/2015 |
| CN | 105896128 A | 8/2016 |

(Continued)

OTHER PUBLICATIONS

Office Action issued in China family member Patent Appl. No. 201780055978.X, dated Dec. 30, 2019, along with an English translation thereof.

(Continued)

*Primary Examiner* — Oscar C Jimenez
(74) *Attorney, Agent, or Firm* — Greenblum & Bernstein, P.L.C.

(57) ABSTRACT

A connector assembly of the present invention includes a first connector having a first electrical-connection member disposed on a flexible base member, and a second connector having a second electrical-connection member disposed on a flexible base member at a position opposite that of the first electrical-connection member. The second connector further includes a flexible cover section, a flexible coupling section, and a plurality of resin fasteners. The coupling section couples the base member of the second connector with the cover section. The resin fasteners are disposed at opposite positions respectively for the base member of the second connector and the cover section. The connector assembly has a structure in which the fasteners are engaged and the first electrical on member and the second electrical-connection member are connected, with the first connector being (Continued)

sandwiched by the base member of the second connector and the cover section.

15 Claims, 14 Drawing Sheets

(58) Field of Classification Search
CPC .. H01R 13/405; H01R 13/52; H01R 13/5219; H01R 13/627; H01R 13/6271; H05K 3/361; H05K 3/368
See application file for complete search history.

(56) References Cited

U.S. PATENT DOCUMENTS

| | | | |
|---|---|---|---|
| 10,098,224 B1* | 10/2018 | Chuo | H05K 1/147 |
| 2009/0283300 A1* | 11/2009 | Grunthaner | G06F 3/0416 |
| | | | 174/254 |
| 2011/0051381 A1 | 3/2011 | Sugiyama et al. | |
| 2014/0111953 A1* | 4/2014 | McClure | G06F 3/044 |
| | | | 361/749 |
| 2014/0307396 A1* | 10/2014 | Lee | G02F 1/133305 |
| | | | 361/749 |
| 2014/0335714 A1* | 11/2014 | Schrader | H01R 12/772 |
| | | | 439/329 |
| 2016/0190719 A1* | 6/2016 | Brzezinski | H01R 12/73 |
| | | | 439/74 |
| 2016/0301485 A1 | 10/2016 | Saitou | |
| 2016/0363306 A1 | 12/2016 | Que | |
| 2018/0062310 A1 | 3/2018 | Matsuo et al. | |
| 2018/0191094 A1* | 7/2018 | Wang | G06F 1/1616 |
| 2019/0252825 A1* | 8/2019 | Matsuo | H01R 13/2414 |
| 2020/0022425 A1* | 1/2020 | Hashiguchi | H01R 4/58 |

FOREIGN PATENT DOCUMENTS

| | | | | |
|---|---|---|---|---|
| JP | 2004-241187 A | | 8/2004 | |
| JP | 2005-225516 A | | 8/2005 | |
| JP | 2006-055280 A | | 3/2006 | |
| JP | 2011-049031 A | | 3/2011 | |
| JP | 2015-135723 A | | 7/2015 | |
| JP | 2016-097273 A | | 5/2016 | |
| JP | 201832531 | * | 8/2016 | H01R 13/52 |
| JP | 2016-164275 A | | 9/2016 | |
| JP | 2016-201647 A | | 12/2016 | |
| JP | 2018-032531 A | | 3/2018 | |
| JP | 2018-063855 A | | 4/2018 | |

OTHER PUBLICATIONS

U.S. Appl. No. 16/332,945 to Kosuke Matsuo et al., filed Mar. 13, 2019.
International Search Report issued in WIPO patent application No. PCT/JP2017/020746 dated Aug. 15, 2017, together with an English translation.

* cited by examiner

CONNECTOR ASSEMBLY

TECHNICAL FIELD

The present invention relates to a connector assembly used to take out an electrical signal from a device that is attached to clothing or a human body.

BACKGROUND ART

As a connector used to take out an electrical signal from a device that is attached to clothing or a human body, technology such as that described in Patent Literature 1 has been known. FIG. 1 shows FIG. 2 illustrated in Patent Literature 1. The abstract of Patent Literature 1 describes, as a problem, "providing a connector that can prevent the sense of wearing and durability from being impaired", and as solving means, "a snap-button connector includes a first cloth 1 having electrical conductivity, a second cloth 2 having electrical conductivity, a snap button 3 that detachably connects the other end of the first cloth 1 and the other end of the second cloth 2 mechanically and electrically. This snap button 3 includes a male snap button 4 connected to the first cloth 1 mechanically and electrically and made of a material having electrical conductivity, and a female snap button 5 connected to the second cloth 2 mechanically and electrically and made of a material having electrical conductivity". Conventional technology for resin fasteners includes that described in Patent Literature 2 and 3.

PRIOR ART LITERATURE

Patent Literature

Patent Literature 1: Japanese Patent Application Laid Open No. 2015-135723
Patent Literature 2: Japanese Patent Application Laid Open No. 2005-225516
Patent Literature 3: Japanese Patent Application Laid Open No. 2006-55280

SUMMARY OF THE INVENTION

Problems to be Solved by the Invention

The applicant of the present application pointed out in Japanese Patent Application No. 2016-164275 and Japanese Patent Application No. 2016-201647, both of which were not laid open when the present application was filed, that, as a problem in the technology described in Patent Literature 1, the technology provided a wearable-device connector attached to clothing or a human body, but its electrical-connection members did not have drip-proof structures (structures that prevent water drops from adhering thereto), and showed means to solve the problem. In the connector assemblies described in these patent applications, engagement members (for example, a resin fastener) are disposed at positions opposed to each other in the first connector and the second connector. Since the engagement members are disposed separately in the first connector and the second connector, which are separated bodies, however, when the base member of the first connector and the base member of the second connector are both flexible, it is not easy to attach or detach the first and second connectors.

A main object of the present invention is to provide a connector assembly that allows a first connector and a second connector to be attached and detached easily even when the base member of the first connector and the base member of the second connector are both flexible.

Means to Solve the Problems

A connector assembly of the present invention includes a first connector having a first electrical-connection member disposed on a flexible base member, and a second connector having a second electrical-connection member disposed on a flexible base member at a position opposite that of the first electrical-connection member. The second connector further includes a flexible cover section, a flexible coupling section, and a plurality of resin fasteners. The coupling section couples the base member of the second connector with the cover section. The plurality of resin fasteners are disposed at facing positions of the base member of the second connector and the cover section. The connector assembly has a structure in which the fasteners are engaged and the first electrical-connection member and the second electrical-connection member are connected, with the first connector being sandwiched by the base member of the second connector and the cover section. The coupling section and the plurality of fasteners are disposed at positions that allow the connection of the first electrical-connection member and the second electrical-connection member to be maintained when the fasteners are engaged.

Effects of the Invention

According to a connector assembly of the present invention, since the fasteners to be engaged with each other are tied via the coupling section, it is easy to perform positioning of the fasteners, and the fasteners are easy to be engaged with each other even if the base members are flexible.

DETAILED DESCRIPTION OF THE EMBODIMENTS

Embodiments of the present invention will be described below in detail. Identical numbers are assigned to components having identical functions, and a duplicate description thereof will be omitted.

First Embodiment

Figure 1:
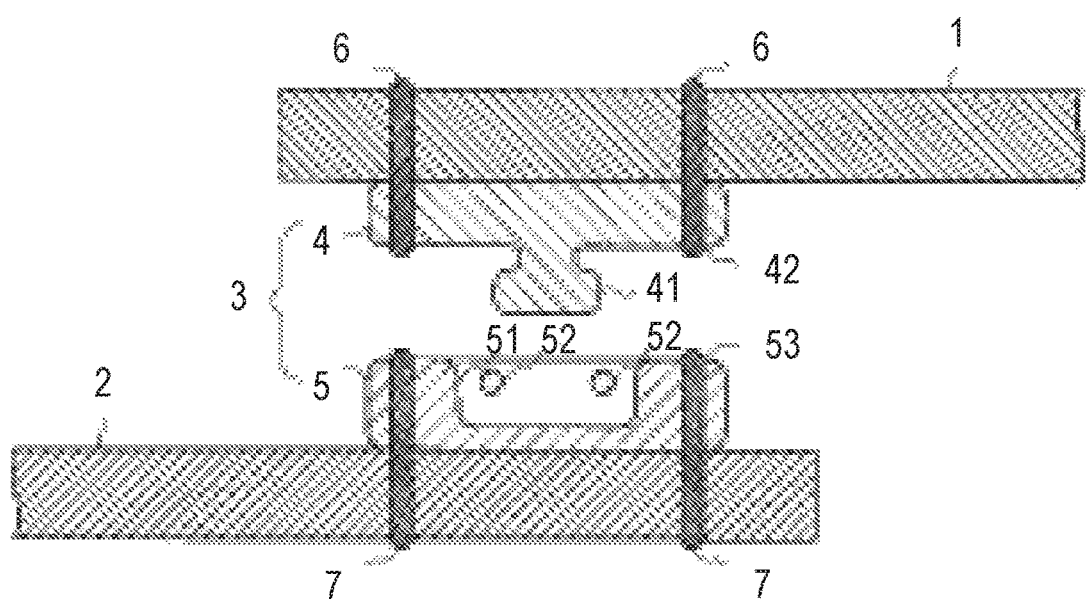
FIG. 1 shows FIG. 2 illustrated in Patent Literature 1.
Figure 2:
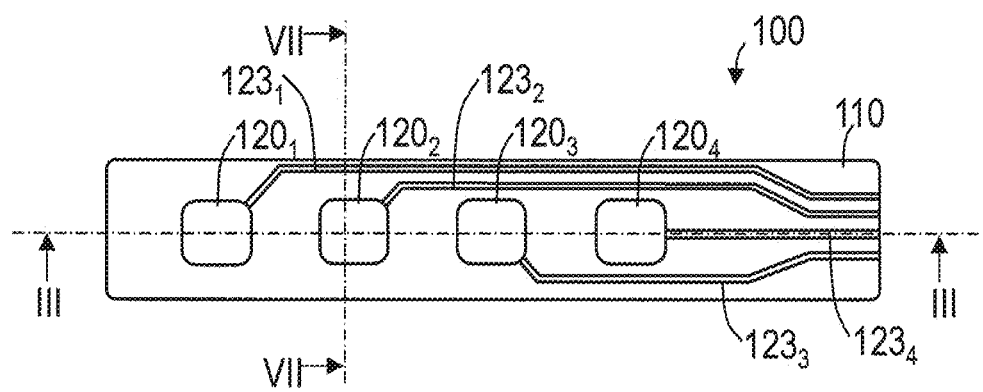
FIG. 2 is a plan of a first connector used in a first embodiment.
Figure 3:
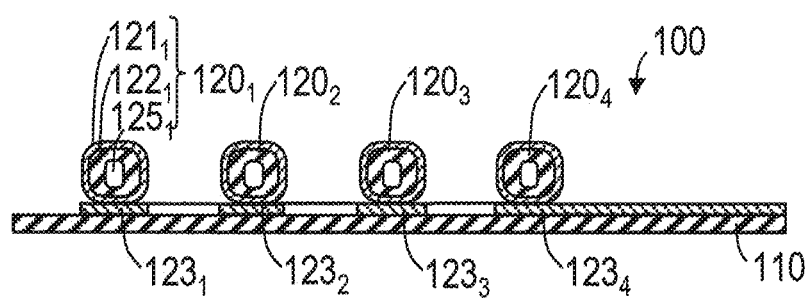
FIG. 3 is a cross-sectional view along III-III in FIG. 2.
Figure 4:
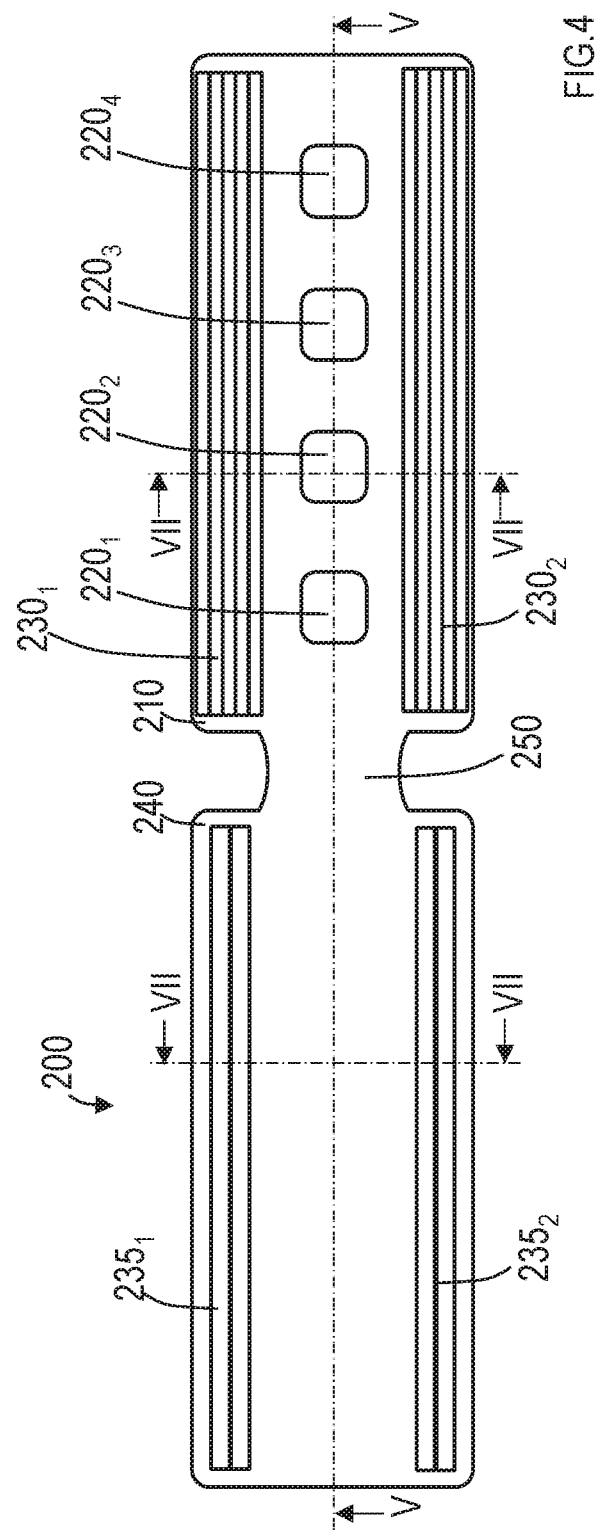
FIG. 4 is a plan of a second connector used in the first embodiment.
Figure 5:
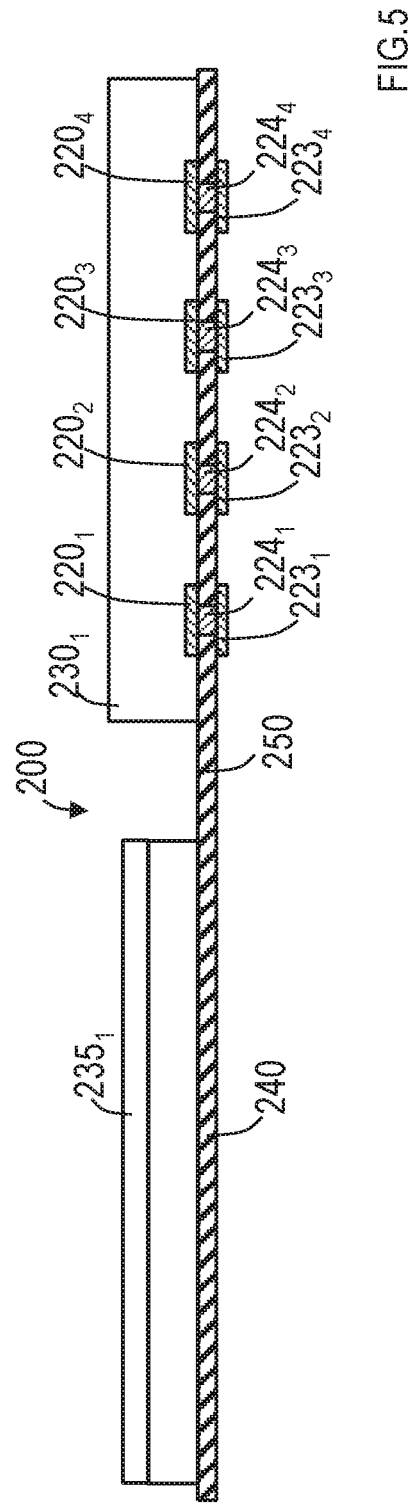
FIG. 5 is a cross-sectional view along V-V in FIG. 4.

FIG. 2 is a plan of a first connector used in a first embodiment. FIG. 3 is a cross-sectional view along III-III in FIG. 2. FIG. 4 is a plan of a second connector used in the first embodiment. FIG. 5 is a cross-sectional view along V-V in FIG. 4. A connector assembly according to the first embodiment includes a first connector 100 having first electrical-connection members $120_1$ to $120_N$ disposed on a flexible base member 110, and a second connector 200 having second electrical-connection members $220_1$ to $220_N$ disposed on a flexible base member 210 at the positions opposite those of the first electrical-connection members $120_1$ to $120_N$. N is an integer equal to or larger than 1; N=4 in FIGS. 2 to 5. Although N equals 4 in FIGS. 2 to 5, it is not limited to that value and should be set to a required value. The first connector 100 should also have lead wiring lines $123_1$ to $123_N$, such as those shown in FIGS. 2 and 3, in order to electrically connect the first electrical-connection members $120_1$ to $120_N$ to an outside device. In FIGS. 2 to 5, the first electrical-connection members $120_1$ to $120_N$ are indirectly disposed on the base member 110 with the lead wiring lines $123_1$ to $123_N$, and the second electrical-connection members $220_1$ to $220_N$ are directly disposed on the base member 210. Here, "being disposed on the base member" means not only being directly disposed on the base member, as described above, but also being indirectly disposed on the base member with another member placed between the base member and the electrical-connection members (this also applies to the other embodiments). Materials used for the flexible base members include a film, such as a film of polyimide, polyester, polypyrene, polystyrene, polyethylene, or vinyl chloride, but the materials are not limited to these examples.

In the example shown in FIG. 3, the first electrical-connection member $120_n$ (n is an integer equal to or larger than one and equal to or smaller than N) includes an elastic protrusion $122_n$ and a first electrode $121_n$ disposed at least at a tip of the protrusion $122_b$. In FIG. 3, the first electrode $121_n$ is formed at the circumference of the protrusion $122_n$ over the perimeter thereof, and is connected to the lead wiring line $123_n$. The first electrode $121_n$ needs to be exposed at the tip of the protrusion $122_n$, but a portion thereof used to connect to the lead wiring line $123_n$, may be electrically connected to the lead wiring line inside the protrusion $122_n$, not at the circumference of the protrusion $122_n$. In the example shown in FIG. 3, a space $125_n$ is formed to make the protrusion $122_n$ hollow. Since the protrusion $122_n$ is made hollow, it is deformed more easily. Rubber materials can be used for the protrusion $122_n$, such as elastomer, polyurethane, polyester, polyamide, polystyrene, polyolefin, vinyl chloride, styrene-butadiene rubber, chloroprene rubber, ethylene propylene rubber silicone, and fluororubber.

In the example shown in FIG. 5, the second electrical-connection member $220_n$ is disposed on the base member 210 and is connected to a terminal $223_n$ provided on the rear surface of the base member 210 via a conductor $224_n$ formed in a through-hole of the base member 210. The terminal $223_n$ is connected to an outside device. When at least either one of the first electrical-connection member $120_n$ and the second electrical-connection member $220_n$ is elastic, it becomes easier to maintain the electrical connection between the first electrical-connection member $120_n$ and the second electrical-connection member $220_n$.

The second connector 200 further includes a flexible cover section 240, a flexible coupling section 250, and a plurality of resin fasteners $230_1$ to $230_M$ and $235_1$ to $235_M$. The coupling section 250 couples the base member 210 of the second connector with the cover section 240. Materials used for the cover section 240 and the coupling section 250 should be those used for the base members, described above. The base member 210, the cover section 240, and the coupling section 250 may be made of different materials, but it is easier to make them as a single unit with an identical material. M is an integer equal to or larger than 2, and equals 2 in FIGS. 4 and 5.

The base member 210 of the second connector 200 and the cover section 240 have the fasteners $230_1$ to $230_M$ and the fasteners $235_1$ to $235_M$ respectively at opposite positions. In FIG. 4, the fasteners $230_1$ to $230_M$ are disposed on the base member 210, and the fasteners $235_1$ to $235_M$ are disposed on the cover section 240. A thermoplastic resin should be used, such as low-density polyethylene, ethylene-α-olefin copolymer, ethylene-vinyl-acetate copolymer, ethylene-acrylic-acid copolymer, and ethylene-acrylic-acid-ester copolymer. The fasteners should be fixed to the base member 210 and the cover section 240 by adhesive or thermal fusion. Patent Literature 2 and 3, and other documents describe resin fasteners in detail.

Figure 6:
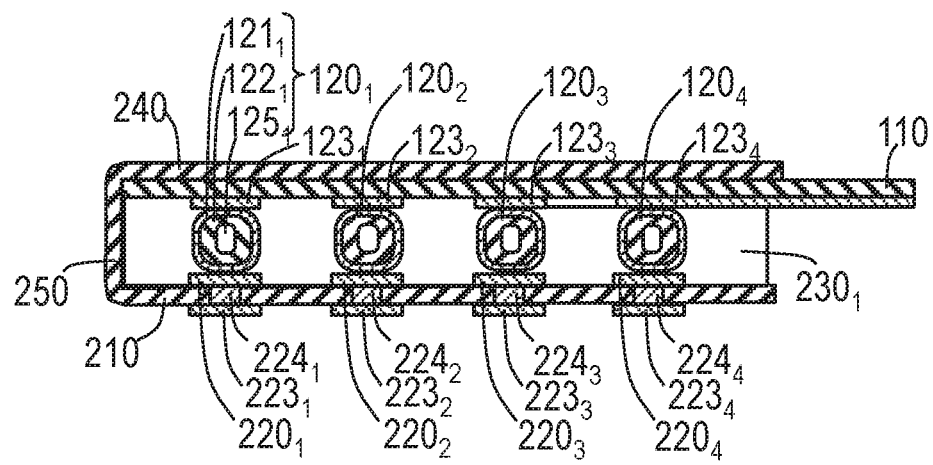
FIG. 6 is a cross-sectional view at the position indicated by III-III in FIG. 2 and V-V in FIG. 4 when the first connector and the second connector are engaged.
Figure 7:
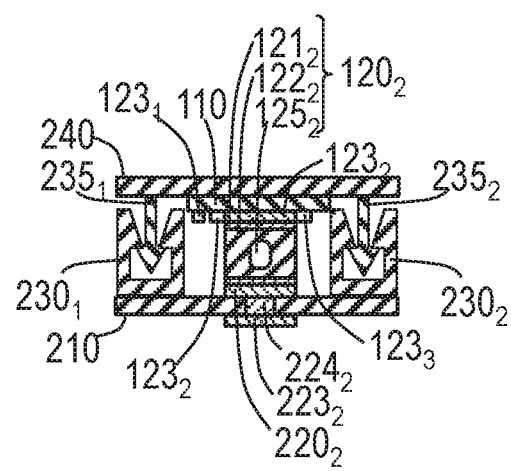
FIG. 7 is a sectional view at the position indicated by VII-VII in FIG. 2 and VII-VII in FIG. 4 when the first connector and the second connector are engaged.

The connector assembly has a structure in which the fasteners $230_1$ and $230_2$ and the fasteners $235_1$ to $235_2$ are engaged, and the first electrical-connection members $120_1$ to $120_N$ and the second electrical-connection members $220_1$ to $220_N$ are connected, with the first connector 100 being sandwiched by the base member 210 of the second connector 200 and the cover section 240. FIG. 6 is a cross-sectional view at the position indicated by III-III in FIG. 2 and V-V in FIG. 4, and FIG. 7 is a sectional view at the position indicated by VII-VII in FIG. 2 and VII-VII in FIG. 4, when the first connector 100 and the second connector 200 are engaged. In these figures, the first connector 100 shown in FIG. 3 is illustrated up-side down. By bending the coupling section 250 in half, the base member 210 of the second connector 200 and the cover section 240 sandwich the first connector 100, the fasteners $230_1$ and $230_2$ and the fasteners $235_1$ to $235_2$ are engaged, and the first electrical-connection members $120_1$ to $120_N$ and the second electrical-connection members $220_1$ to $220_N$ are connected. In FIG. 6, the cross section of the first connector 100 is viewed from the direction opposite that indicated by the arrows attached to the line III-III in FIG. 2. There are two VII-VII lines in FIG. 4, but they match on a plan when the coupling section 250 is bent in half.

The coupling section 250 and the plurality of fasteners $230_1$ to $230_M$ and $235_1$ to $235_M$ are disposed such that the first electrical-connection members $120_1$ to $120_N$ and the second electrical-connection members $220_1$ to $220_N$ are maintained in the connected state when the fasteners $230_1$ to $230_M$ and the fasteners $235_1$ to $235_M$ are engaged. For example, the plurality of fasteners $230_1$ to $230_M$ provided on the base member 210 of the second connector 200 and the coupling section 250 should be disposed so as to surround the second electrical-connection members $220_1$ to $220_N$ in a U-shape. Here, a "U-shape" includes a rectangular shape without one side, and a V-shape, which includes straight lines. It is not necessary to make a U-shape completely and continuously, but a noncontinuous portion is allowed so long as the connections between the first electrical-connection members $120_1$ to $120_N$ and the second electrical-connection members $220_1$ to $220_N$ are maintained. In addition, the portion where the line is not closed in a U-shape is used to place the lead wiring lines $123_1$ to $123_N$ of the first connector. A "U-shape" also includes a polygon, such as a hexagon, with one side thereof being opened.

In FIG. 4, M equals two, but M is not necessarily limited to two. As shown in FIG. 4, however, when two sets of fasteners $230_1$, $230_2$, $235_1$, and $235_2$ are disposed in parallel, and the coupling section 250 couples the base member 210 with the cover section 240 in the direction perpendicular to the longitudinal directions of the fasteners $230_1$, $230_2$, $235_1$, and $235_2$, it is easy to attach and detach the connectors, and it is also easy to maintain the connections between the first electrical-connection members $120_1$ to $120_N$ and the second electrical-connection members $220_1$ to $220_N$ when the fasteners $230_1$ and $235_1$ are engaged and the fasteners $230_2$ and $235_2$ are engaged. This arrangement also corresponds to the "U-shape", described above. In addition, when there are a plurality of sets of first electrical-connection members $120_1$ to $120_N$ and second electrical-connection members $220_1$ to $220_N$, if the longitudinal directions of the two fasteners $230_1$ and $230_2$ on the base member 210 of the second connector 200 are made parallel to the direction in which the second electrical-connection members $220_1$ to $220_N$ are disposed, it is easy to engage the fasteners $230_1$ and $230_2$ and the fasteners $235_1$ to $235_2$ and to connect the first electrical-connection members $120_1$ to $120_N$ and the second electrical-connection members $220_1$ to $220_N$, and it is also easy to maintain the connected state.

According to the connector assembly of the first embodiment, since the fasteners to be engaged, $230_1$ and $230_2$, and $235_1$ and $235_2$, are tied via the coupling section 250, it is easy to position the mating fasteners and, even if the base members 110 and 210 are flexible, it is also easy to engage the fasteners. In addition, the coupling section 250, the fasteners $230_1$ to $230_M$, and the fasteners $235_1$ to $235_M$ are disposed such that the first electrical-connection members $120_1$ to $120_N$ and the second electrical-connection members $220_1$ to $220_N$ are maintained in the connected state when the fasteners $230_1$ to $230_M$ and the fasteners $235_1$ to $235_M$ are engaged. Especially in the example shown in FIG. 4, since the fasteners $230_1$ and $230_2$ are disposed in parallel so as to sandwich the second electrical-connection members $220_1$ to $220_N$, and the coupling section 250 couples the base member 210 with the cover section 240 in the direction perpendicular to the longitudinal directions of the fasteners $230_1$ and $230_2$, it is even easier to engage the fasteners. In addition, since the longitudinal directions of the fasteners $230_1$ and $230_2$ are parallel to the direction in which the second electrical-connection members $220_1$ to $220_N$ are disposed, it is easy to connect the first electrical-connection members $120_1$ to $120_N$ and the second electrical-connection members $220_1$ to $220_N$, and it is also easy to maintain the connected state.

First Modification

The first embodiment shows a structure in which it is easy to attach and detach the first connector and the second connector even if the base members of the first and second connectors are flexible, which is the main object of the present invention. This structure is effective when water-tightness is provided outside the connector assembly or when the connector assembly is used for a purpose where water-tightness is not required. In the present modification, a structure in which a connector assembly itself is water-tight (waterproof at least in living environments) is shown. Here, water-tightness means a characteristic whereby water is prevented from reaching the contact portions of first electrical-connection members $120_1$ to $120_N$ and second electrical-connection members $220_1$ to $220_N$.

Figure 8:
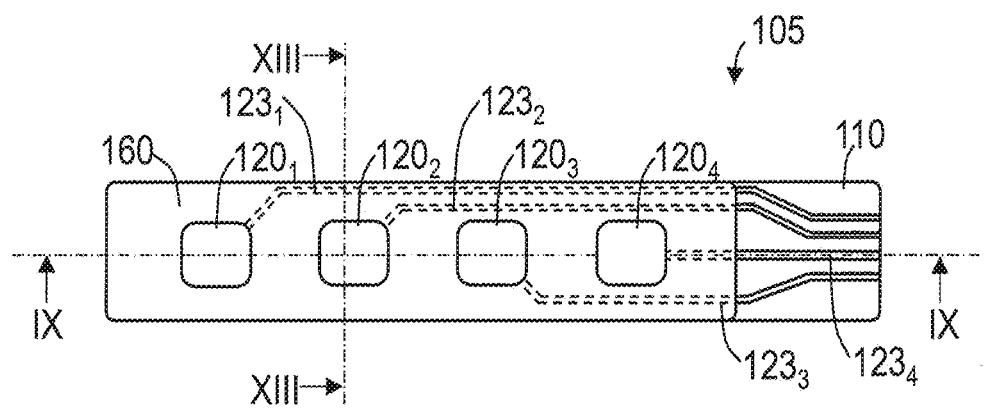
FIG. 8 is a plan of a first connector used in a first modification of the first embodiment.
Figure 9:
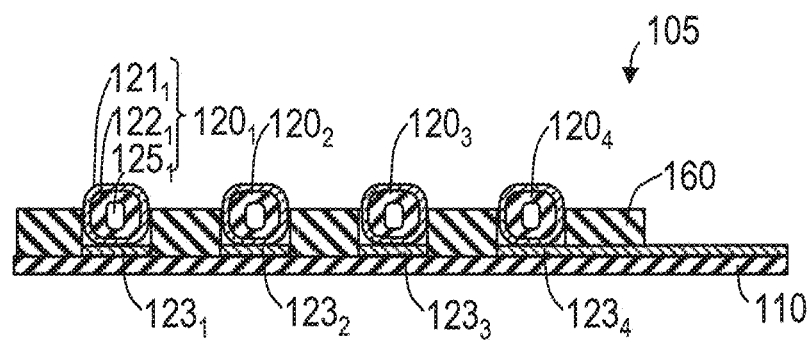
FIG. 9 is a cross-sectional view along IX-IX in FIG. 8.
Figure 10:
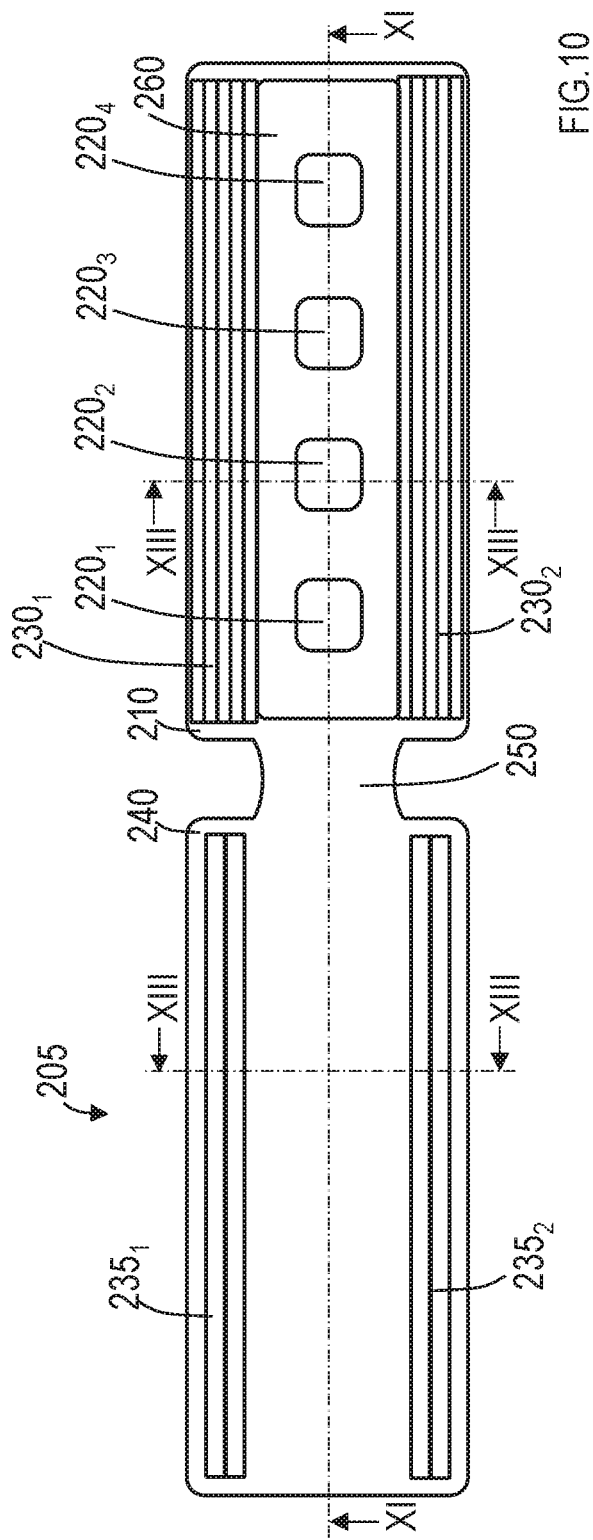
FIG. 10 is a plan of a second connector used in the first modification of the first embodiment.
Figure 11:
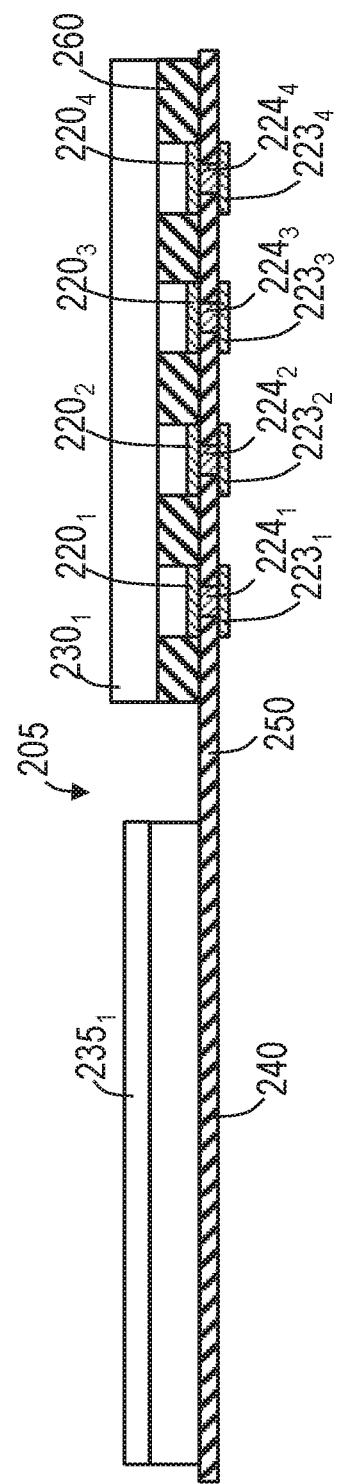
FIG. 11 is a cross-sectional view along XI-XI in FIG. 10.

FIG. 8 is a plan of a first connector used in the present modification. FIG. 9 is a cross-sectional view along IX-IX in FIG. 8. FIG. 10 is a plan of a second connector used in the present modification. FIG. 11 is a cross-sectional view along XI-XI in FIG. 10. Base members 110 and 210, the first electrical-connection members $120_1$ to $120_N$, lead wiring lines $123_1$ to $123_N$, the second electrical-connection members $220_1$ to $220_N$, a conductor $224_n$, a terminal $223_n$, a cover section 240, a coupling section 250, fasteners $230_1$ to $230_M$, and fasteners $235_1$ to $235_M$ are the same as those in the first embodiment.

In the present modification, a first elastic member 160 is formed so as to surround the first electrical-connection members $120_1$ to $120_N$, on the base member 110 of a first connector 105. In addition, a second elastic member 260 is formed so as to surround the second electrical-connection members $220_1$ to $220_N$, on the base member 210 of a second connector 205. Rubber materials can be used for the first elastic member 160 and the second elastic member 260, such as elastomer, polyurethane, polyester, polyamide, polystyrene, polyolefin, vinyl chloride, styrene-butadiene rubber, chloroprene rubber, ethylene propylene rubber silicone, and fluororubber.

Figure 12:
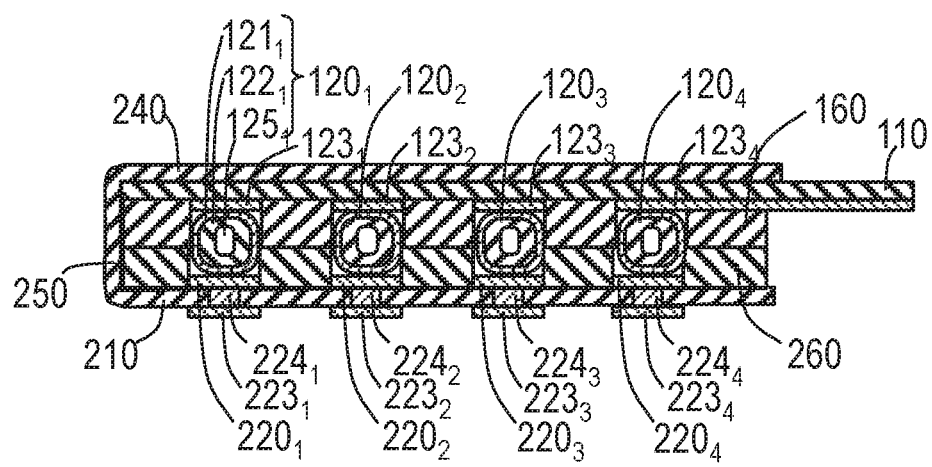
FIG. 12 is a cross-sectional view at the position indicated by IX-IX in FIG. 8 and XI-XI in FIG. 10 when the first connector and the second connector are engaged.
Figure 13:
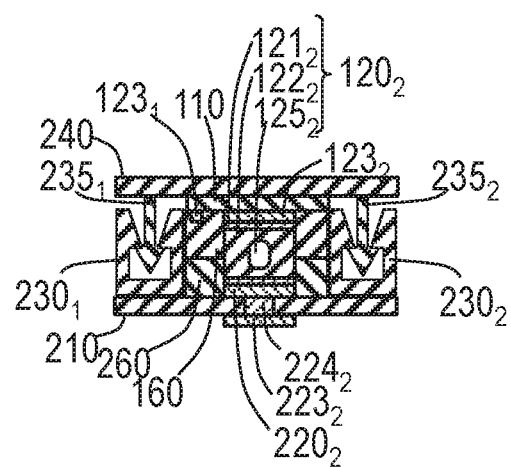
FIG. 13 is a sectional view at the position indicated by XIII-XIII in FIG. 8 and XIII-XIII in FIG. 10 when the first connector and the second connector are engaged.

FIG. 12 is a cross-sectional view at the position indicated by IX-IX in FIG. 8 and XI-XI in FIG. 10, and FIG. 13 is a sectional view at the position indicated by VIII-VIII in FIG. 8 and XIII-XIII in FIG. 10, when the first connector 105 and the second connector 205 are engaged. The cross section of the first connector 105 shown in FIG. 12 is viewed from the direction opposite that indicated by arrows attached to the IX-IX line in FIG. 8. FIG. 10 shows two XIII-XIII lines, but they match in a plan when the coupling section 250 is bent in half.

When the fasteners $230_1$ and $230_2$ and the fasteners $235_1$ to $235_2$ are engaged, and the first electrical-connection members $120_1$ to $120_N$ and the second electrical-connection members $220_1$ to $220_N$ are connected, the first elastic member 160 and the second elastic member 260 provide water-tightness for the connected portions of the first electrical-connection members $120_1$ to $120_N$ and the second electrical-connection members $220_1$ to $220_N$. When water-repellent treatment is applied to facing portions of the first elastic member 160 and the second elastic member 260, even if a gap exists between the first elastic member 160 and the second elastic member 260 due to a manufacturing error or other reasons, waterproofness in living environments is obtained.

Therefore, the connector assembly of the present modification provides water-tightness (a characteristic whereby water is prevented from reaching the contact portions of the first electrical-connection members $120_1$ to $120_N$ and the second electrical-connection members $220_1$ to $220_N$) while acquiring the same advantages as the connector assembly of the first embodiment.

Second Embodiment

Figure 14:
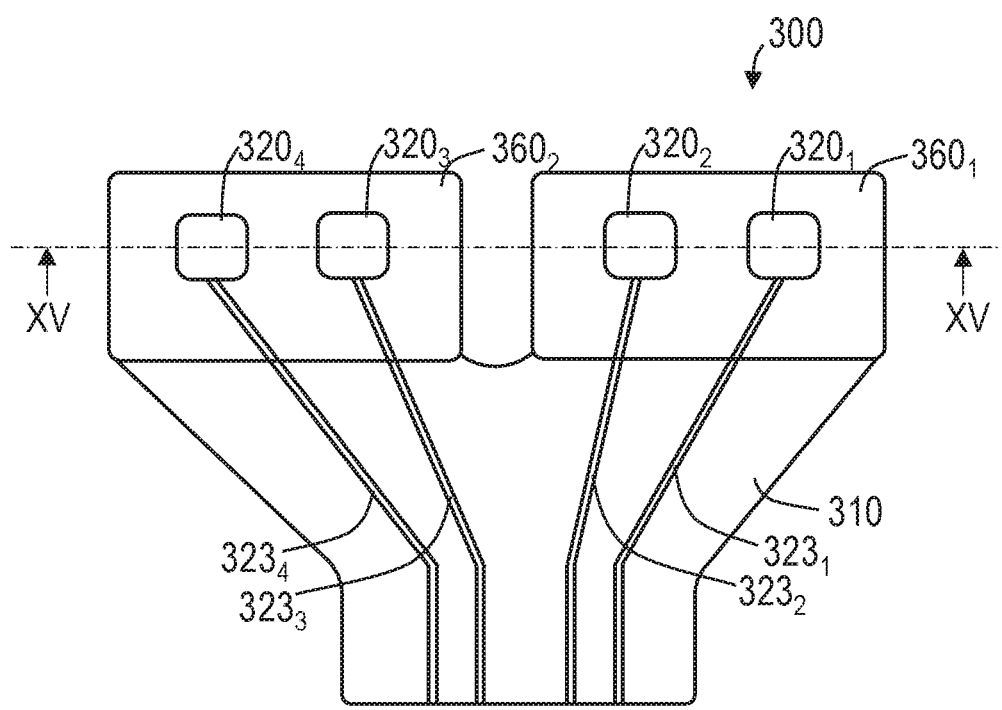
FIG. 14 is a plan of a first connector used in a second embodiment.
Figure 15:
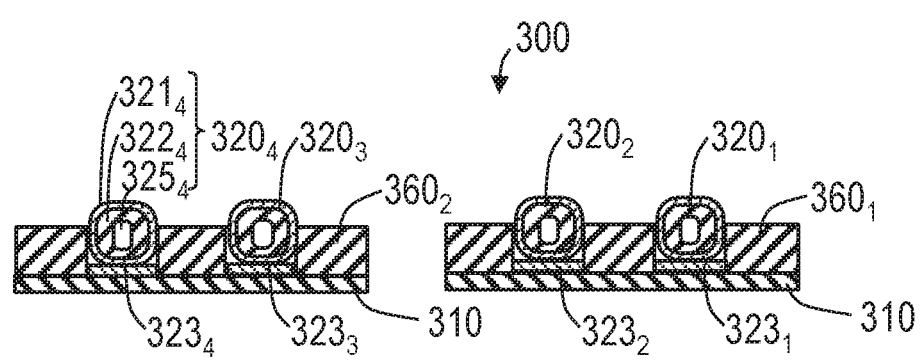
FIG. 15 is a cross-sectional view along XV-XV in FIG. 14.
Figure 16:
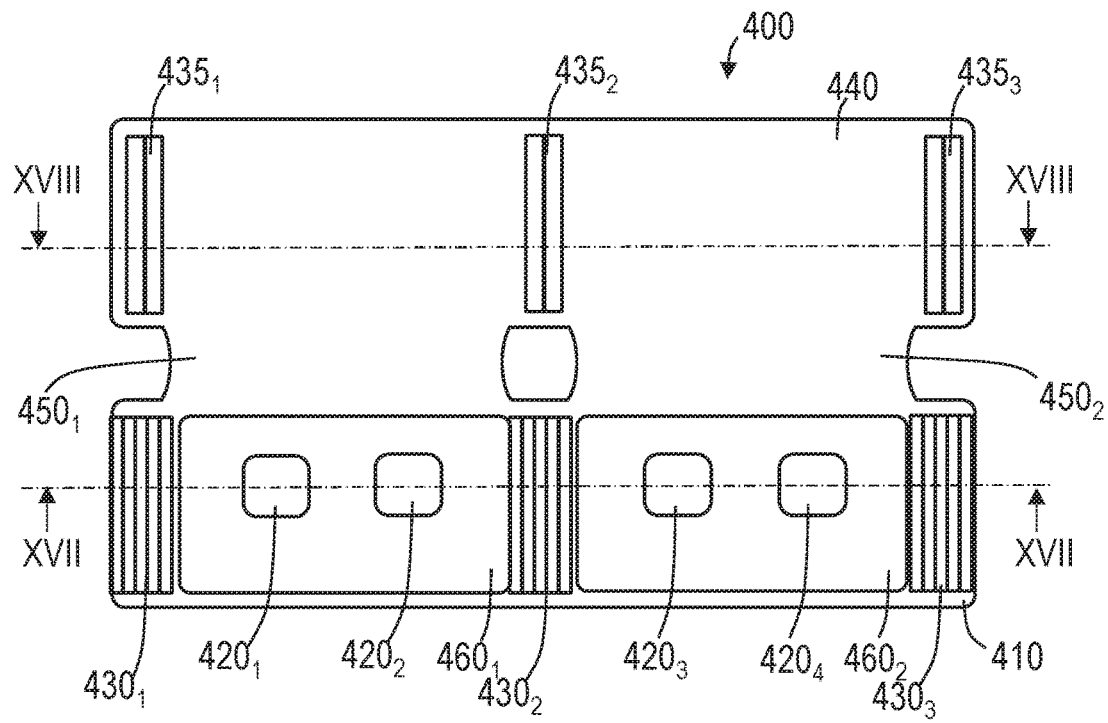
FIG. 16 is a plan of a second connector used in the second embodiment.
Figure 17:
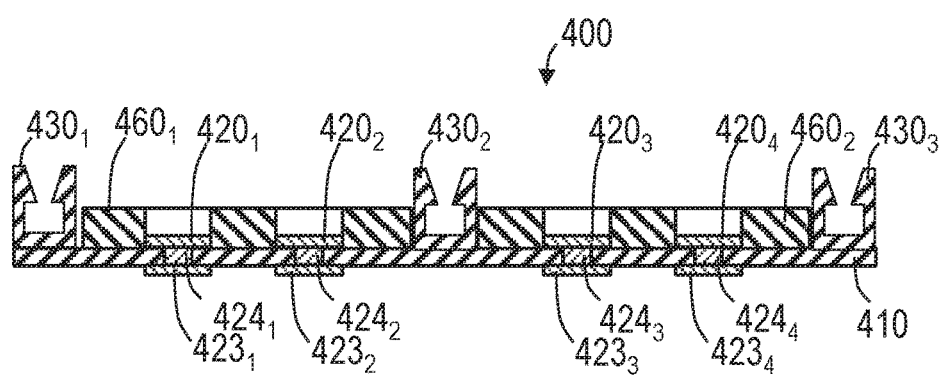
FIG. 17 is a cross-sectional view along XVII-XVII in FIG. 16.

FIG. 14 is a plan of a first connector used in a second embodiment. FIG. 15 is a cross-sectional view along XV-XV in FIG. 14. FIG. 16 is a plan of a second connector used in the second embodiment. FIG. 17 is a cross-sectional view along XVII-XVII in FIG. 16. A connector assembly according to the second embodiment includes a first connector 300 having first electrical-connection members $320_1$ to $320_N$ disposed on a flexible base member 310, and a second connector 400 having second electrical-connection members $420_1$ to $420_N$ disposed on a flexible base member 410 at the positions opposite those of the first electrical-connection members $320_1$ to $320_N$. N is an integer equal to or larger than 1; N=4 in FIGS. 14 to 17. Although N equals 4 in FIGS. 14 to 17, it is not necessarily limited to that value and should be set to a required value. The first connector 300 should also have lead wiring lines $323_1$ to $323_N$ such as those shown in FIGS. 14 and 15 in order to electrically connect the first electrical-connection members $320_1$ to $320_N$ to an outside device. In FIGS. 14 to 17, the first electrical-connection members $320_1$ to $320_N$ are indirectly disposed on the base member 310 with the lead wiring lines $323_1$ to $323_N$, and the second electrical-connection members $420_1$ to $420_N$ are directly disposed on the base member 410. Here, "being disposed on the base member" means not only being directly disposed on the base member, as described above, but also being indirectly disposed on the base member with another member placed between the base member and the electrical-connection members.

In the example shown in FIG. 15, the first electrical-connection member $320_n$ (n is an integer equal to or larger than 1 and equal to or smaller than N) includes an elastic protrusion $322_n$ and a first electrode $321_n$ disposed at least at a tip of the protrusion $322_n$. In FIG. 15, the first electrode $321_n$ is formed at the circumference of the protrusion $322_n$ over the perimeter thereof, and is connected to the lead wiring line $323_n$. The first electrode $321_n$ needs to be exposed at the tip of the protrusion $322_n$, but a portion thereof used to connect to the lead wiring line $323_n$ may be electrically connected to the lead wiring line inside the protrusion $322_n$. In the example shown in FIG. 15, a space $325_n$ is formed to make the protrusion $322_n$ hollow. Since the protrusion $322_n$ is made hollow, it is deformed more easily. Example materials that can be used for the protrusion $322_n$ are the same as those described in the first embodiment.

In the example shown in FIG. 17, the second electrical-connection member $420_n$ is disposed on the base member 410, and is connected to a terminal $423_n$ provided on the rear surface of the base member 410 via a conductor $424_n$ formed in a through-hole of the base member 410. The terminal $423_n$ is connected to an outside device. When at least either one of the first electrical-connection member $320_n$ and the second electrical-connection member $420_n$ is elastic, it becomes easier to maintain the electrical connection between the first electrical-connection member $320_n$ and the second electrical-connection member $420_n$.

The second connector 400 further includes a flexible cover section 440, flexible coupling sections $450_1$ and $450_2$, and a plurality of resin fasteners $430_1$ to $430_M$ and $435_1$ to $435_M$. The coupling sections $450_1$ and $450_2$ couple the base member 410 of the second connector with the cover section 440. Materials used for the cover section 440 and the coupling sections $450_1$ and $450_2$ should be those used for the base members, described in the first embodiment. The base member 410, the cover section 440, and the coupling sections $450_1$ and $450_2$ may be made of different materials, but it is easier to make them as a single unit with an identical material. M is an integer equal to or larger than 2, and equals 3 in FIGS. 16 and 17.

The base member 410 of the second connector 400 and the cover section 440 have the plurality of resin fasteners $430_1$ to $430_M$ and the fasteners $435_1$ to $435_M$ respectively at opposite positions. In FIG. 16, the fasteners $430_1$ to $430_M$ are disposed on the base member 410, and the fasteners $435_1$ to $435_M$ are disposed on the cover section 440. Example resin materials that can be used for the fasteners are the same as those described in the first embodiment. The fasteners should be fixed to the base member 410 and the cover section 440 by adhesive or thermal fusion.

First elastic members $360_1$ and $360_2$ are formed so as to surround the first electrical-connection members $320_1$ to $320_N$, on the base member 310 of the first connector 300. Second elastic members $460_1$ and $460_2$ are formed so as to surround the second electrical-connection members $420_1$ to $420_N$, on the base member 410 of the second connector 400. Materials that can be used for these elastic members are the same as in the first modification of the first embodiment.

Figure 18:
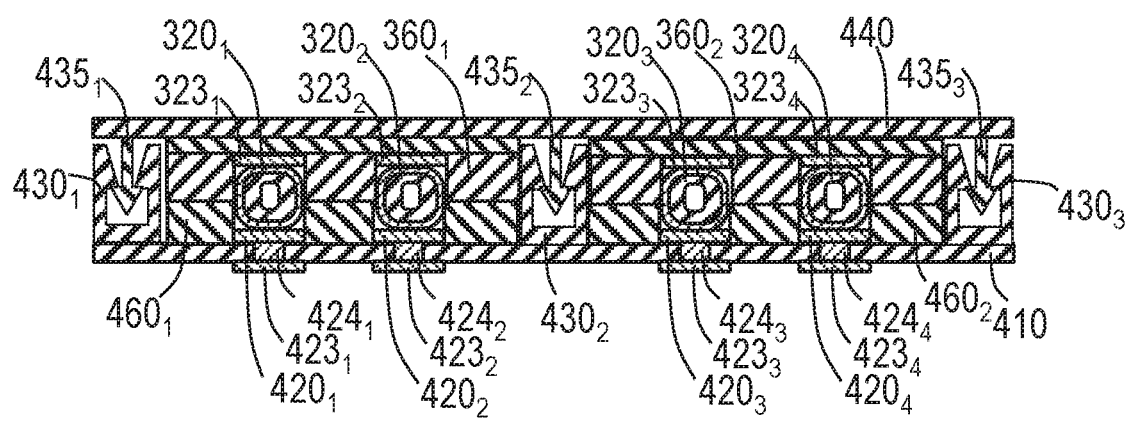
FIG. 18 is a cross-sectional view at the position indicated by XV-XV in FIG. 14 and XVII-XVII in FIG. 16 when the first connector and the second connector are engaged.

The connector assembly has a structure in which the fasteners $430_1$ to $430_3$ and the fasteners $435_1$ to $435_3$ are engaged, and the first electrical-connection members $320_1$ to $320_N$ and the second electrical-connection members $420_1$ to $420_N$ are connected, with the first connector 300 being sandwiched by the base member 410 of the second connector 400 and the cover section 440. FIG. 18 is a cross-sectional view at the position indicated by XV-XV in FIG. 14 and XVII-XVII in FIG. 16, when the first connector 300 and the second connector 400 are engaged. In FIG. 18, the first connector 300 shown in FIG. 15 is illustrated up-side down and left-side right. By bending the coupling sections $450_1$ and $450_2$ in half, the base member 410 of the second connector 400 and the cover section 440 sandwich the first connector 300, the fasteners $430_1$ to $430_3$ and the fasteners $435_1$ to $435_3$ are engaged, and the first electrical-connection members $320_1$ to $320_N$ and the second electrical-connection members $420_1$ to $420_N$ are connected. Since FIG. 18 shows a cross section of the state in which the coupling sections $450_1$ and $450_2$ are bent in half, not only the cross section at the position indicated by XVII-XVII in FIG. 16 but also the cross section at the position indicated by XVIII-XVIII in FIG. 16 are shown.

The coupling sections $450_1$ and $450_2$, the fasteners $430_1$ to $430_M$, and the fasteners $435_1$ to $435_M$ are disposed such that the first electrical-connection members $320_1$ to $320_N$ and the second electrical-connection members $420_1$ to $420_N$ are maintained in the connected state when the fasteners $430_1$ to $430_M$ and the fasteners $435_1$ to $435_M$ are engaged. For example, the fasteners $430_1$ to $430_M$ provided on the base member 410 of the second connector 400 and the coupling sections $450_1$ and $450_2$ should be disposed so as to surround the second electrical-connection members $420_1$ to $420_N$ in a U-shape. Here, a "U-shape" means the same as in the first embodiment. In the example shown in FIG. 16, the fasteners $430_1$ and $430_2$ and the coupling section $450_1$ form one U shape, and the fasteners $435_1$ and $435_2$ and the coupling section $450_2$ form another U shape. This type of arrangement also corresponds to the U-shape. Lead wiring lines $323_1$ to $323_N$ of the first connector 300 are drawn out from a portion where the U shape is open.

When the fasteners $430_1$ and $430_M$ and the fasteners $435_1$ to $435_M$ are engaged, the coupling sections $450_1$ and $450_2$, the fasteners $430_1$ to $430_M$, and the fasteners $435_1$ to $435_M$ make the first elastic members $360_1$ and $360_2$ and the second elastic members $460_1$ and $460_2$ provide water-tightness for the connected portions of the first electrical-connection members $320_1$ to $320_N$ and the second electrical-connection members $420_1$ to $420_N$. When water-repellent treatment is applied to facing portions of the first elastic members $360_1$ and $360_2$ and the second elastic members $460_1$ and $460_2$, even if a gap exists between the first elastic members $360_1$ and $360_2$ and the second elastic members $460_1$ and $460_2$ due to a manufacturing error or other reasons, waterproofness in living environments is obtained.

According to the connector assembly of the second embodiment, since the fasteners to be engaged, $430_1$ to $430_3$, and $435_1$ to $435_3$, are tied via the coupling sections $450_1$ and $450_2$, it is easy to engaged the fasteners even if the base members 310 and 410 are flexible. In addition, the coupling sections $450_1$ and $450_2$, the fasteners $430_1$ to $430_M$, and the fasteners $435_1$ to $435_M$ are disposed such that the first electrical-connection members $320_1$ to $320_N$ and the second electrical-connection members $420_1$ to $420_N$ are maintained in the connected state when the fasteners $430_1$ to $430_M$, and the fasteners $435_1$ to $435_M$ are engaged. In particular, since the fasteners $430_1$ and $430_2$ are disposed in parallel so as to sandwich the second electrical-connection members $420_1$ and $420_2$, the fasteners $430_2$ and $430_3$ are disposed in parallel so as to sandwich the second electrical-connection members $420_3$ and $420_4$, and the coupling sections $450_1$ and $450_2$ couple the base member 410 with the cover section 440 in the direction perpendicular to the longitudinal directions of the fasteners $430_1$ to $430_3$, it is easy to engage the fasteners. In addition, the connector assembly of the present embodiment provides water-tightness (a characteristic whereby water is prevented from reaching the contact portions of the first electrical-connection members $320_1$ to $320_N$ and the second electrical-connection members $420_1$ to $420_N$).

Third Embodiment

Figure 19:
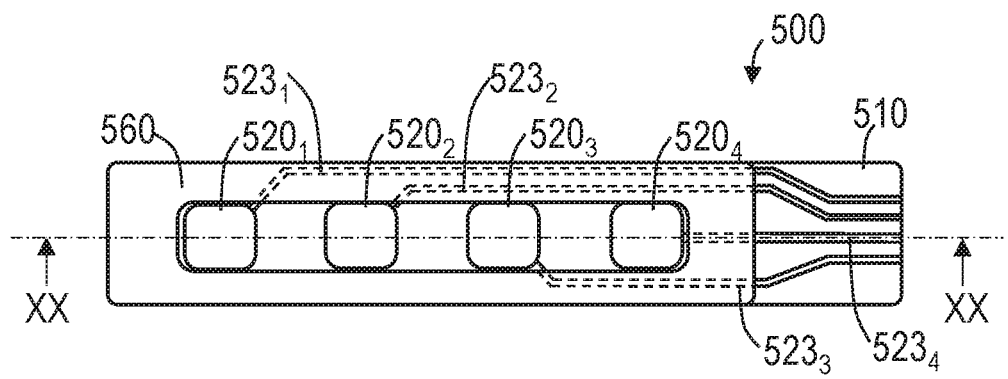
FIG. 19 is a plan of a first connector used in a third embodiment.
Figure 20:
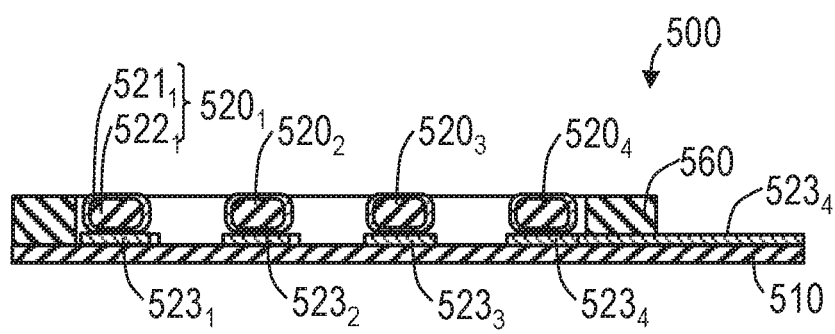
FIG. 20 is a cross-sectional view along XX-XX in FIG. 19.
Figure 21:
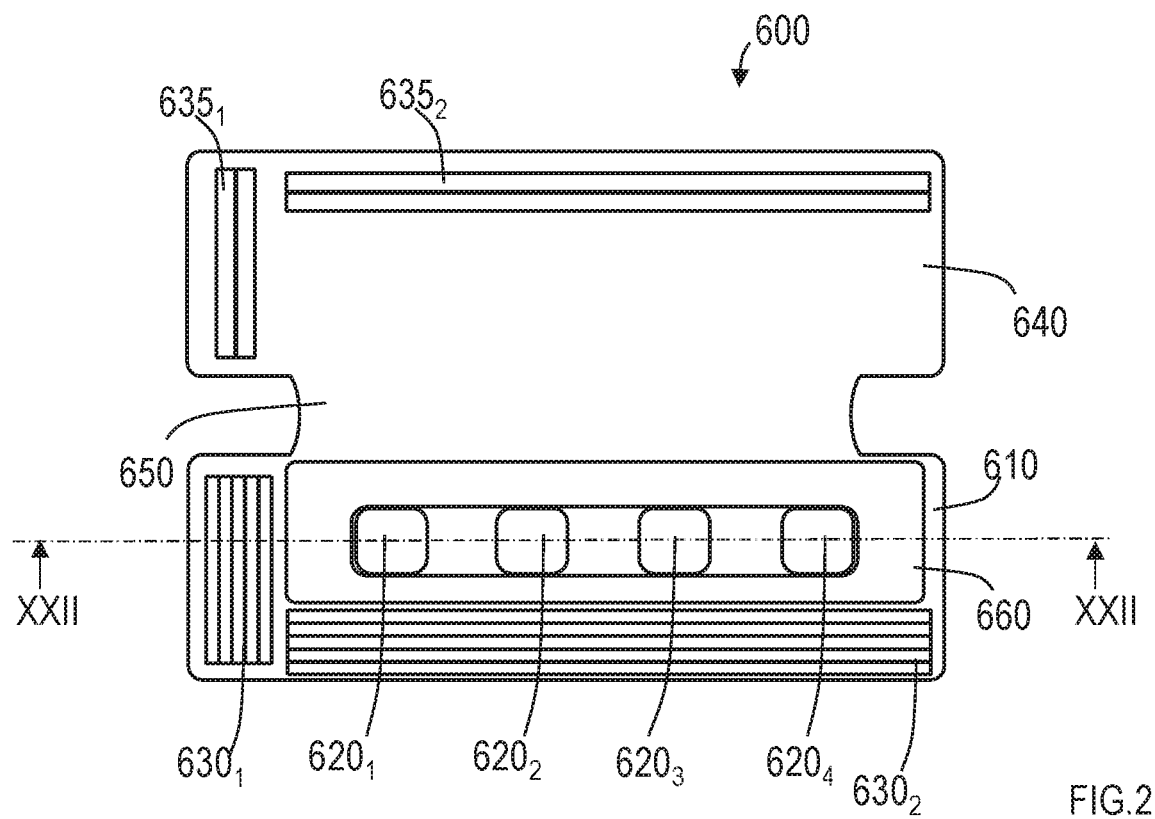
FIG. 21 is a plan of a second connector used in the third embodiment.
Figure 22:
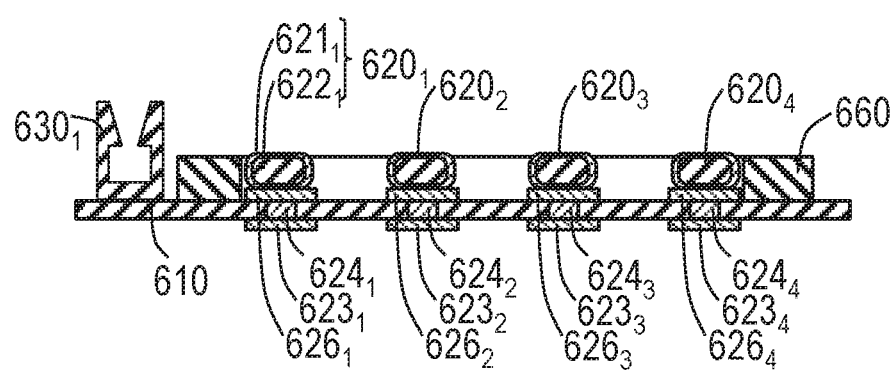
FIG. 22 is a cross-sectional view along XXII-XXII in FIG. 21.

FIG. 19 is a plan of a first connector used in a third embodiment. FIG. 20 is a cross-sectional view along XX-XX in FIG. 19. FIG. 21 is a plan of a second connector used in the third embodiment. FIG. 22 is a cross-sectional view along XXII-XXII in FIG. 21. A connector assembly according to the third embodiment includes a first connector 500 having first electrical-connection members $520_1$ to $520_N$ disposed on a flexible base member 510, and a second connector 600 having second electrical-connection members $620_1$ to $620_N$ disposed on a flexible base member 610 at the positions opposite those of the first electrical-connection members $520_1$ to $520_N$. N is an integer equal to or larger than 1; N=4 in FIGS. 19 to 22. N equals 4 in FIGS. 19 to 22, but it is not necessarily limited to that value and should be set to a required value. The first connector 500 should also have lead wiring lines $523_1$ to $523_N$ such as those shown in FIGS. 19 and 20 in order to electrically connect the first electrical-connection members $520_1$ to $520_N$ to an outside device. In FIGS. 19 to 22, the first electrical-connection members $520_1$ to $520_N$ are disposed on the base member 510 with the lead wiring lines $523_1$ to $523_N$, and the second electrical-connection members $620_1$ to $620_N$ are disposed on electrodes $626_1$ to $626_N$ on the base member 610. Here, "being disposed on the base member" also includes being indirectly disposed on the base member with another member placed between the base member and the electrical-connection members.

In the example shown in FIG. 20, the first electrical-connection member $520_n$ (n is an integer equal to or larger than 1 and equal to or smaller than N) includes an elastic protrusion $522_n$ and a first electrode $521_n$ disposed at least at a tip of the protrusion $522_n$. In FIG. 20, the first electrode $521_n$ is formed at the circumference of the protrusion $522_n$ over the perimeter thereof, and is connected to the lead wiring line $523_n$. The first electrode $521_n$ needs to be exposed at the tip of the protrusion $522_n$, but a portion thereof used to connect to the lead wiring line $523_n$ may be electrically connected to the lead wiring line inside the protrusion $522_n$. In the third embodiment, the protrusion $522_n$ is not provided with a space inside thereof. Example materials that can be used for the protrusion $522_n$ are the same as those described in the first embodiment.

In the example shown in FIG. 22, the second electrical-connection member $620_n$ includes an elastic protrusion $622_n$ and a second electrode $621_n$ disposed at least at a tip of the protrusion $622_n$. In FIG. 22, the second electrode $621_n$ is formed at the circumference of the protrusion $622_n$ over the perimeter thereof, and is connected to an electrode $626_n$ on the base member 610. The second electrode $621_n$ needs to be exposed at the tip of the protrusion $622_n$, but a portion thereof used to connect to the electrode $626_n$ may be electrically connected to the electrode inside the protrusion $622_n$. The electrode $626_n$ is connected to a terminal $623_n$ provided on the rear surface of the base member 610 via a conductor $624_n$ formed in a through-hole of the base member 610. The terminal $623_n$ is connected to an outside device. Example materials used for the protrusion $622_n$ are the same as the materials for the protrusion $522_n$. The third embodiment shows an example in which both the first electrical-connection member $520_n$ and the second electrical-connection member $620_n$ are elastic. With this example, it becomes easier to maintain the electrical connection between the first electrical-connection member $520_n$ and the second electrical-connection member $620_n$.

The second connector 600 further includes a flexible cover section. 640, a flexible coupling section 650, and resin fasteners $630_1$ to $630_M$ and fasteners $635_1$ to $635_M$. The coupling section 650 couples the base member 610 of the second connector with the cover section 640. Materials used fir the cover section 640 and the coupling section 650 should be those used for the base members, described in the first embodiment. The base member 610, the cover section 640, and the coupling section 650 may be made of different materials, but it is easier to make them as a single unit with an identical material. M is an integer equal to or larger than 2, and equals 2 in FIG. 21.

The base member 610 of the second connector 600 and the cover section 640 have the fasteners $630_1$ to $630_M$ and the fasteners $635_1$ to $635_M$ respectively at opposite positions. In FIG. 21, the fasteners $630_1$ to $630_M$ are disposed on the base member 610, and the fasteners $635_1$ to $635_M$ are disposed on the cover section 640. Example resin materials that can be used for the fasteners are the same as those described in the first embodiment. The fasteners should be fixed to the base member 610 and the cover section 640 by adhesive or thermal fusion.

A first elastic member 560 is formed so as to surround the first electrical-connection members $520_1$ to $520_N$, on the base member 510 of the first connector 500. A second elastic member 660 is formed so as to surround the second electrical-connection members $620_1$ to $620_N$, on the base member 610 of the second connector 600. Materials that can be used for these elastic members are the same as in the first modification of the first embodiment. The third embodiment differs from the first modification of the first embodiment in that the first elastic member 560 is formed so as to surround the entire group of the first electrical-connection members $520_1$ to $520_N$ in the third embodiment, whereas the first elastic member 160 surrounds the first electrical-connection members $520_1$ to $520_N$ individually in the first modification of the first embodiment. The same difference applies to the second electrical-connection members $620_1$ to $620_N$.

The connector assembly has a structure in which the fasteners $630_1$ to $630_M$ and the fasteners $635_1$ to $635_M$ are engaged, and the first electrical-connection members $520_1$ to $520_N$ and the second electrical-connection members $620_1$ to $620_N$ are connected, with the first connector 500 being sandwiched by the base member 610 of the second connector 600 and the cover section 640. In the example shown in FIGS. 19 to 22, the fasteners $630_1$ and $630_2$ and the fasteners $635_1$ and $635_2$ are engaged, and the first electrical-connection members $520_1$ to $520_4$ and the second electrical-connection members $620_1$ to $620_4$ are connected.

The coupling section 650, the fasteners $630_1$ and $630_2$, and the fasteners $635_1$ and $635_2$ are disposed such that the first electrical-connection members $520_1$ to $520_4$ and the second electrical-connection members $620_1$ to $620_4$ are maintained in the connected state when the fasteners $630_1$ and $630_2$ and the fasteners $635_1$ and $635_2$ are engaged. In the example shown in FIGS. 19 to 22, the fasteners $630_1$ and $630_2$ provided on the base member 610 of the second connector 600, and the coupling section 650 are disposed so as to surround the second electrical-connection members $620_1$ to $620_4$ in a U-shape. Here, a "U-shape" means the same as in the first embodiment. In the example shown in FIG. 21, the fastener $630_2$ and the coupling section $450_1$ are disposed in parallel to sandwich the second electrical-connection members $620_1$ to $620_4$. In addition, the fastener $630_1$ is disposed perpendicular to the direction in which the fastener $630_2$ and the coupling section 650 are disposed, thereby forming a U shape to surround the second electrical-connection members $620_1$ to $620_4$. This type of arrangement also corresponds to the U-shape. Lead wiring lines $523_1$ to $523_N$ of the first connector 500 are drawn out from a portion where the U shape is open.

When the fasteners $630_1$ and $630_2$ and the fasteners $635_1$ and $635_2$ are engaged, the coupling section 650, the fasteners $630_1$ and $630_2$, and the fasteners $635_1$ and $635_2$ make the first elastic member 560 and the second elastic member 660 provide water-tightness for the connected portions of the first electrical-connection members $520_1$ to $520_4$ and the second electrical-connection members $620_1$ to $620_4$. When water-repellent treatment is applied to facing portions of the first elastic member 560 and the second elastic member 660, even if a gap exists between the first elastic member 560 and the second elastic member 660 due to a manufacturing error or other reasons, waterproofness in living environments is obtained.

According to the connector assembly of the third embodiment, since the fasteners to be engaged, $630_1$ and $630_2$, and $635_1$ and $635_2$, are tied via the coupling section 650, it is easy to engage the fasteners even if the base members 510 and 610 are flexible. In addition, the coupling section 650, the fasteners $630_1$ and $630_2$, and the fasteners $635_1$ and $635_2$ are disposed such that the first electrical-connection members $520_1$ to $520_4$ and the second electrical-connection members $620_1$ to $620_4$ are maintained in the connected state when the fasteners $630_1$ and $630_2$ and the fasteners $635_1$ and $635_2$ are engaged. In addition, the connector assembly of the present embodiment provides water-tightness (a characteristic whereby water is prevented from reaching the contact portions of the first electrical-connection members $520_1$ to $520_4$ and the second electrical-connection members $620_1$ to $620_4$).

DESCRIPTION OF REFERENCE NUMERALS 100, 105, 300, 500: First connector
110, 210, 310, 410, 510, 610: Base member
120, 320, 520: First electrical-connection member
121, 321, 521: First electrode
122, 322, 522, 622: Protrusion
123, 323, 523: Lead wiring line
125, 325: Space
160, 360, 560: First elastic member
200, 205, 400, 600: Second connector
220, 420, 620: Second electrical-connection member
223, 423, 623: Terminal
224, 424, 624: Conductor
230, 235, 430, 435, 630, 635: Fastener
240, 440, 640: Cover section
250, 450, 650: Coupling section
260, 460, 660: Second elastic member
621: Second electrode
626: Electrode

What is claimed is:

1. A connector assembly comprising:
   a first connector comprising a first electrical-connection member disposed on a flexible base member; and
   a second connector comprising a second electrical-connection member disposed on a flexible base member at a position opposite that of the first electrical-connection member;
   the second connector further comprising:
   a flexible cover section;
   a flexible coupling section that couples the base member of the second connector with the cover section; and
   a plurality of resin fasteners provided at opposite positions respectively for the base member of the second connector and the cover section;
   the connector assembly having a structure in which the fasteners are engaged and the first electrical-connection member and the second electrical-connection member are connected, with the first connector being sandwiched by the base member of the second connector and the cover section;
   the coupling section and the plurality of fasteners being disposed at positions that allow the connection of the first electrical-connection member and the second electrical-connection member to be maintained when the fasteners are engaged.

2. The connector assembly according to claim 1,
   wherein a first elastic member is formed so as to surround the first electrical-connection member on the base member of the first connector;
   a second elastic member is formed so as to surround the second electrical-connection member on the base member of the second connector;
   the first elastic member and the second elastic member prevent water from reaching a connected portion of the first electrical-connection member and the second electrical-connection member, when the fasteners are engaged and the first electrical-connection member and the second electrical-connection member are connected.

3. The connector assembly according to claim 2, wherein water-repellent treatment is applied to facing portions of the first elastic member and the second elastic member.

4. The connector assembly according to claim 1, wherein at least either one of the first electrical-connection member and the second electrical-connection member is elastic.

5. A connector assembly comprising:
a first connector comprising a first electrical-connection member disposed on a flexible base member; and
a second connector comprising a second electrical-connection member disposed on a flexible base member at a position opposite that of the first electrical-connection member;
the second connector further comprising:
a flexible cover section;
a flexible coupling section that couples the base member of the second connector with the cover section; and
a plurality of resin fasteners provided at opposite positions respectively for the base member of the second connector and the cover section;
the plurality of fasteners on the base member of the second connector and the coupling section being disposed at positions that surround the second electrical-connection member in a U-shape;
the fasteners being engaged and the first electrical-connection member and the second electrical-connection member being connected, with the first connector being sandwiched by the base member of the second connector and the cover section.

6. The connector assembly according to claim 5,
wherein a first elastic member is formed so as to surround the first electrical-connection member on the base member of the first connector;
a second elastic member is formed so as to surround the second electrical-connection member on the base member of the second connector;
the first elastic member and the second elastic member prevent water from reaching a connected portion of the first electrical-connection member and the second electrical-connection member, when the fasteners are engaged and the first electrical-connection member and the second electrical-connection member are connected.

7. The connector assembly according to claim 6, wherein water-repellent treatment is applied to facing portions of the first elastic member and the second elastic member.

8. The connector assembly according to claim 5, wherein at least either one of the first electrical-connection member and the second electrical-connection member is elastic.

9. A connector assembly comprising:
a first connector comprising a first electrical-connection member disposed on a flexible base member; and
a second connector comprising a second electrical-connection member disposed on a flexible base member at a position opposite that of the first electrical-connection member;
the second connector further comprising:
a flexible cover section;
a flexible coupling section that couples the base member of the second connector with the cover section; and
two resin fasteners provided at opposite positions respectively for the base member of the second connector and the cover section;
the two fasteners on the base member of the second connector being disposed in parallel so as to sandwich the second electrical-connection member;
the coupling section coupling the base member of the second connector with the cover section in a direction perpendicular to the fasteners;
the fasteners being engaged and the first electrical-connection member and the second electrical-connection member being connected, with the first connector being sandwiched by the base member of the second connector and the cover section.

10. The connector assembly according to claim 9, further comprising one or more first electrical-connection members identical to the first electrical-connection member, and one or more second electrical-connection members identical to the second electrical-connection members,
wherein the longitudinal directions of the two fasteners on the base member of the second connector are parallel to a direction in which the second electrical-connection members are disposed.

11. The connector assembly according to claim 10,
wherein a first elastic member is formed so as to surround the first electrical-connection member on the base member of the first connector;
a second elastic member is formed so as to surround the second electrical-connection member on the base member of the second connector;
the first elastic member and the second elastic member prevent water from reaching a connected portion of the first electrical-connection member and the second electrical-connection member, when the fasteners are engaged and the first electrical-connection member and the second electrical-connection member are connected.

12. The connector assembly according to claim 11, wherein water-repellent treatment is applied to facing portions of the first elastic member and the second elastic member.

13. The connector assembly according to claim 9,
wherein a first elastic member is formed so as to surround the first electrical-connection member on the base member of the first connector;
a second elastic member is formed so as to surround the second electrical-connection member on the base member of the second connector;
the first elastic member and the second elastic member prevent water from reaching a connected portion of the first electrical-connection member and the second electrical-connection member, when the fasteners are engaged and the first electrical-connection member and the second electrical-connection member are connected.

14. The connector assembly according to claim 13, wherein water-repellent treatment is applied to facing portions of the first elastic member and the second elastic member.

15. The connector assembly according to claim 9, wherein at least either one of the first electrical-connection member and the second electrical-connection member is elastic.

* * * * *